(12) United States Patent  
Nishizuka (10) Patent No.: US 8,809,199 B2
(45) Date of Patent: Aug. 19, 2014

(54) METHOD OF ETCHING FEATURES IN SILICON NITRIDE FILMS

(75) Inventor: Tetsuya Nishizuka, Portland, OR (US)

(73) Assignee: Tokyo Electron Limited, Tokyo (JP)

( * ) Notice: Subject to any disclaimer, the term of this patent is extended or adjusted under 35 U.S.C. 154(b) by 309 days.

(21) Appl. No.: 13/026,232

(22) Filed: Feb. 12, 2011

(65) Prior Publication Data

US 2012/0208369 A1 Aug. 16, 2012

(51) Int. Cl.
*H01L 21/302* (2006.01)
*H01L 21/461* (2006.01)
*H01L 21/311* (2006.01)
*H01J 37/32* (2006.01)

(52) U.S. Cl.
CPC ..... *H01L 21/31116* (2013.01); *H01J 37/32192* (2013.01); *H01L 21/31144* (2013.01)
USPC ....... 438/724; 438/714; 216/67; 257/E21.218

(58) Field of Classification Search
CPC .................. H01L 21/31144; H01L 21/31116; H01J 37/32192
USPC .............. 438/714, 724; 257/E21.218; 216/67
See application file for complete search history.

(56) References Cited

U.S. PATENT DOCUMENTS

| 6,001,690 | A * | 12/1999 | Chien et al. ............. 438/266 |
| 7,344,965 | B2 | 3/2008 | Zhang et al. |
| 7,718,538 | B2 | 5/2010 | Kim et al. |
| 7,807,574 | B2 | 10/2010 | Yu et al. |
| 2004/0005784 | A1 * | 1/2004 | Chen et al. .............. 438/710 |
| 2007/0020937 | A1 | 1/2007 | Chen et al. |
| 2007/0167001 | A1 | 7/2007 | Ohmi et al. |
| 2008/0017868 | A1 * | 1/2008 | Yoneda .................... 257/79 |
| 2008/0292973 | A1 | 11/2008 | Stamper |
| 2009/0242513 | A1 | 10/2009 | Funk et al. |
| 2009/0263919 | A1 | 10/2009 | Hori et al. |
| 2010/0025821 | A1 | 2/2010 | Ohmi et al. |
| 2010/0136797 | A1 | 6/2010 | Kabe et al. |
| 2010/0178770 | A1 | 7/2010 | Zin |
| 2011/0143537 | A1 * | 6/2011 | Lee et al. ................. 438/669 |

FOREIGN PATENT DOCUMENTS

JP  2010118549     5/2010
WO  2010110878 A1  9/2010

OTHER PUBLICATIONS

S. Wolf and R.N. Tauber, (Silicon Processing for the VLSI Era, vol. 1—Process Technology, Lattice Press, 1986, pp. 523) Relied on only as evidence.*

United States Patent and Trademark Office, International Search Report and Written Opinion for corresponding International Application No. PCT/US12/24017, mailed May 24, 2012, 25 pages.

* cited by examiner

*Primary Examiner* — Duy Deo
*Assistant Examiner* — Mahmoud Dahimene (57) ABSTRACT

A processing method is provided for plasma etching features in a silicon nitride (SiN) film covered by a mask pattern. The method includes preparing a film stack on a substrate, the film stack containing a SiN film on the substrate and a mask pattern on the SiN film, forming a plasma from a process gas containing HBr gas, $O_2$ gas, and a carbon-fluorine-containing gas, applying pulsed RF bias power to the substrate, and transferring the mask pattern to the SiN film by exposing the film stack to the plasma.

19 Claims, 6 Drawing Sheets

METHOD OF ETCHING FEATURES IN SILICON NITRIDE FILMS

FIELD OF THE INVENTION

The present invention relates to a method for fabricating a semiconductor device, and more particularly, to a plasma etching method of silicon nitride (SiN) films using a patterned mask.

BACKGROUND OF THE INVENTION

Many semiconductor fabrication methods employ plasma to perform etching processes where material on a wafer is removed in specific areas to subsequently form the components/features of the devices (e.g., transistors, capacitors, conductive lines, vias, and the like) on the wafer. The fabrication methods use a mask pattern that is formed over areas of the wafer that are to be protected from the etching process.

During etching of deep features requiring long plasma exposure times, the mask pattern may be completely removed from the wafer surface and thereby leave the surface unprotected. Therefore, etching of deep features on a wafer can be limited by the etch selectivity between the material of the mask pattern and the material to be etched, where higher the selectivity, the deeper the feature may be etched. Furthermore, etching of deep features generally requires straight feature sidewalls and high etch selectivity to material at the bottom of the features.

Silicon nitride (SiN) films are widely used in microfabrication processes as a dielectric and mask material. Semiconductor processing often involves etching features in a relatively thick layer of SiN film on a Si wafer substrate or on a relatively thin layer of silicon dioxide ($SiO_2$) supported upon a Si wafer substrate, where high selectivity of SiN etching over both Si and $SiO_2$ is strongly desired to reduce or prevent damages in an underlying $SiO_2$ film or Si substrate.

There is a need for new methods for increasing the selectivity during etching of deep SiN features with straight sidewalls, such that a sufficient portion of the mask pattern remains to cover areas of the wafer to be protected until the etch process is complete and such that the underlying substrate materials are not etched or damaged.

SUMMARY OF THE INVENTION

Embodiments of the invention provide processing methods for plasma etching features in SiN films covered by a mask pattern. The processing methods utilize a process gas containing HBr gas, $O_2$ gas, and a carbon-fluorine-containing gas in combination with applying pulsed radio frequency (RF) biasing power to the substrate to provide deep SiN features with straight sidewalls, and good etch selectivity to the mask pattern and underlying materials.

According to one embodiment of the invention, the method includes preparing a film stack on a substrate, the film stack containing a silicon nitride (SiN) film on the substrate and a mask pattern on the SiN film, forming a plasma from a process gas containing HBr gas, $O_2$ gas, and a carbon-fluorine-containing gas, applying pulsed RF bias power to the substrate, and transferring the mask pattern to the SiN film by exposing the film stack to the plasma.

According to another embodiment of the invention, transferring the mask pattern to the SiN film includes etching through less than an entire thickness of SiN film in a main etch (ME) step by applying a first pulsed RF bias power to the substrate during the ME step, and thereafter, etching through a remaining thickness of the SiN film and stopping on the substrate in an over etch (OE) step by applying a second pulsed RF bias power that is lower than the first pulsed RF bias power applied to the substrate during the ME process.

According to yet another embodiment of the invention, the method includes preparing a film stack on a substrate, the film stack containing a silicon nitride (SiN) film on the substrate and a mask pattern on the SiN film, the substrate containing a Si film, a $SiO_2$ film, or a combination thereof, and the mask pattern containing a SiON film, a $SiO_2$ film, or a combination thereof. The method further includes forming a plasma from a process gas containing HBr gas, $O_2$ gas, and a $CF_4$ gas by exciting the process gas by a microwave plasma source including a radial line slot antenna (RLSA), and transferring the mask pattern to the SiN film by exposing the film stack to the plasma. The transferring includes etching through less than an entire thickness of SiN film in a main etch (ME) step by applying a first pulsed RF bias power level to the substrate during the ME step, and thereafter, etching through a remaining thickness of the SiN film and stopping on the substrate in an over etch (OE) step by applying a second pulsed RF bias power that is lower than the first pulsed RF bias power level applied to the substrate during the OE process.

DETAILED DESCRIPTION OF SEVERAL EMBODIMENTS

Embodiments of the invention are described with reference to the accompanying drawings, in which exemplary embodiments of the invention are shown. The ensuing description is not intended to limit the scope, applicability or configuration of the disclosure. Rather, the ensuing description of several exemplary embodiments will provide those skilled in the art with an enabling description for implementing exemplary embodiments of the invention. It should be noted that embodiments of the invention may be embodied in different forms without departing from the spirit and scope of the invention as set forth in the appended claims.

Embodiments of the invention are directed to a SiN plasma etching process that provides SiN etch features (e.g., trenches) with straight sidewall profiles and high etch selectivity of SiN to an overlying mask pattern and to a material at the bottom of the SiN etch features. In some embodiments, the SiN etch features are formed using a mask pattern containing $SiO_2$, SiON, or a combination thereof. In some embodiments, the material at the bottom of the SiN etch features contains $SiO_2$, Si, or a combination thereof. The straight sidewall profiles of the SiN etch features and the high etch selectivity are achieved using a process gas containing HBr gas, $O_2$ gas, and a carbon-fluorine-containing gas containing a fluorocarbon gas, a hydrofluorocarbon gas, or a combination thereof. The fluorocarbon gas can contain or consist of $CF_4$, and the hydrofluorocarbon gas can contain or consist of $CHF_3$, $CH_2F_2$, or $CH_3F$, or a combination thereof. The process gas can further contain a noble gas such as argon (Ar) or helium (He).

Figure 1A:
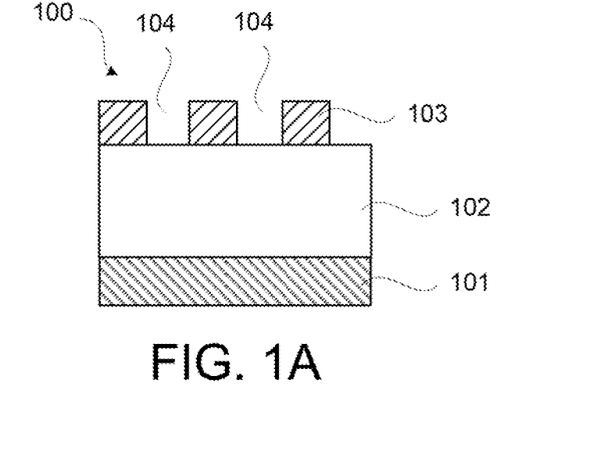
FIGS. 1A-1C show transfer of a mask pattern through a SiN film on a substrate according to an embodiment of the invention.

FIG. 1A shows a mask pattern formed on a SiN film on a substrate according to an embodiment of the invention. A film structure 100 contains a mask pattern 103 with mask openings 104 exposing a SiN film 102, and a substrate 101 under the SiN film 102. The mask pattern 103 can, for example, contain $SiO_2$, SiON, or a combination thereof. The mask pattern 103 can have a linewidth or critical dimension (CD) and may be formed by conventional lithography and etching methods, for example using a photoresist (PR), and one or more layers selected from a silicon-containing antireflective coating (Si-ARC) and an organic dielectric layer (ODL). In some examples the mask pattern 103 can have a CD less than 100 nm, less than 50 nm, or less than 40 nm.

Figure 1B:
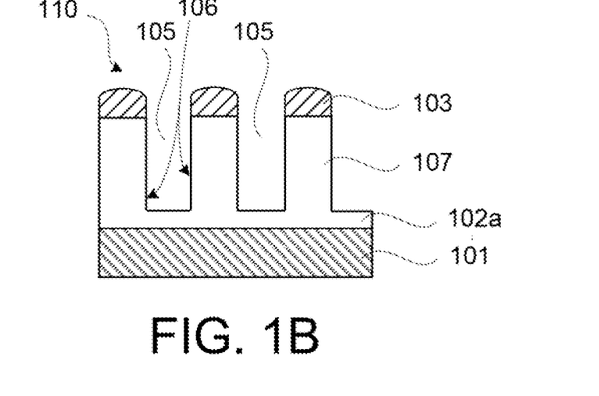

According to embodiments of the invention, the film structure 100 is plasma etched to form SiN etch features 105 (e.g., trenches) with straight sidewall profiles and high etch selectivity of the SiN film 102 to the mask pattern 103 and a material at the bottom of the SiN etch features 105. FIG. 1B schematically shows transfer of the mask pattern 103 into the SiN film 102 in a high etch rate in a main etching (ME) step, thereby forming SiN pattern 107 and SiN etch features 105. After the ME step, the film structure 110 contains an unetched portion 102a of the SiN film 102. According to embodiments of the invention, the ME step utilizes a process gas containing HBr gas, $O_2$ gas, and a carbon-fluorine-containing gas. In some examples, during the ME step, the process chamber pressure may be between about 30 mTorr and about 200 mT, or between about 50 mTorr and about 150 mT.

According to one embodiment of the invention, the ME step is performed using a first pulsed RF bias power that is applied to the substrate 101 through a substrate holder supporting the substrate 101 that contains the film structure 100. The use of the first pulsed RF bias power provides straight SiN sidewalls 106 in the SiN etch features 105 and provides high etch selectivity of the SiN film 102 relative to the mask pattern 103.

Figure 1C:
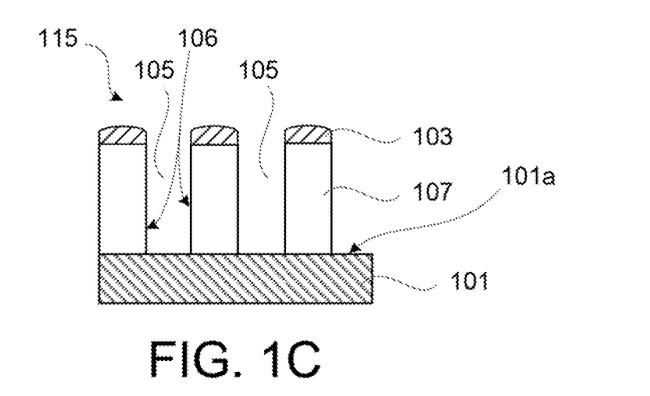

The ME step is followed by a low etch rate over-etching (OE) step using a process gas containing HBr gas, $O_2$ gas, and a carbon-fluorine-containing gas. In some examples, during the OE step, the process chamber pressure may be between about 10 mTorr and about 200 mT, or between about 30 mTorr and about 100 mT. The OE step may further utilize a second pulsed RF bias power to provide required etch selectivity of SiN film 102 to the mask pattern 103 and to the material of the substrate 101 at the bottom of the SiN etch features 105. According to some embodiments of the invention, the second pulsed RF bias power in the OE step can be lower than the first pulsed RF bias power in the ME step. The OE step may be performed for a time period that removes the unetched portion 102a of the SiN film 102 and an additional time period in order to ensure complete removal of the unetched portion 102a of the SiN film 102 in the SiN etch features 105 while stopping on the surface 101a of the substrate 101. FIG. 1C schematically shows a film structure 115 that contains SiN etch features 105 that extend through the entire SiN film 102 and stop on the surface 101a following the OE step. According to some embodiments, the SiN pattern 107 can have aspect ratios (height/width) between 1 and 5, or between 2 and 4.

Figure 2:
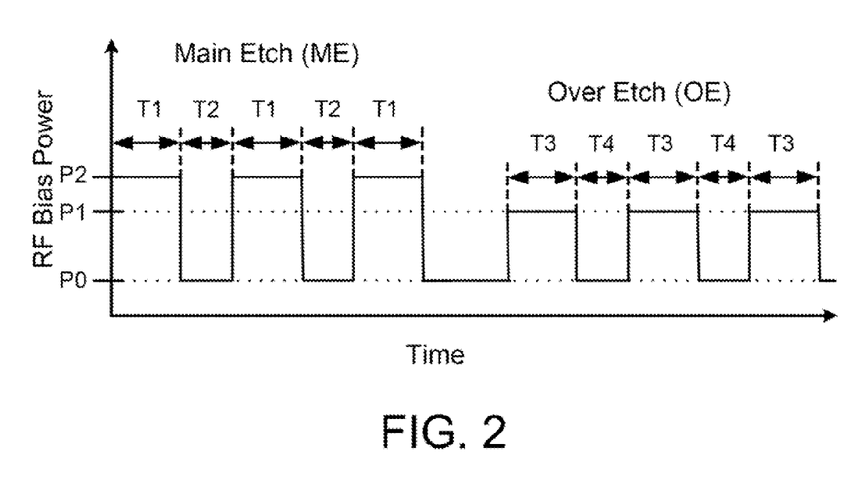
FIG. 2 schematically shows pulsing of RF bias power to a substrate during plasma etching according to embodiments of the invention.

FIG. 2 schematically shows pulsing of RF bias power to a substrate during plasma etching according to embodiments of the invention. The RF bias power applied to the substrate holder supporting the substrate during the ME step is maintained at a RF bias power P2 for a time period T1 (ON period), and thereafter, the RF bias power is maintained at a RF bias power P0 for a time period T2 (OFF period), where the RF bias power P2 is greater than the RF bias power P0. According to some embodiments of the invention, the RF bias power P2 can be 100 W or greater, for example 110 W, 120 W, 130 W, 140 W, 150 W, 160 W, or greater. The RF power P0 can be 0 W or greater than 0 W, for example 10 W, 20 W, 30 W, 40 W, 50 W, or greater. According to some embodiments of the invention, the time period T1 can be greater than the time period T2. In other words, the duty cycle (T1/T1+T2) can be greater than 0.5 (50%), for example greater than 0.6 (60%), greater than 0.7 (70%), greater than 0.8 (80), or even greater than 0.9 (90%). In other embodiments, the time period T2 can be equal to or greater than the time period T1. The pulsing frequency of the RF bias power P2 can be greater than 1 Hz, for example 2 Hz, 4 Hz, 6 Hz, 8 Hz, 10 Hz, 20 Hz, 30 Hz, 50 Hz, or greater. For clarity, FIG. 2 only shows three pulse cycles of the pulsed RF bias power during the ME step but those skilled in the art will readily realize that a typical ME step will contain a large number of pulses. For example, for a ME step of 400 seconds using a pulse frequency of 10 Hz, contains 4,000 pulses of the pulsed RF bias power.

Still referring to FIG. 2, the RF bias power applied to the substrate holder supporting the substrate during the OE step is maintained at a RF bias power P1 for a time period T3 (ON period), and thereafter, the RF bias power is maintained at a RF bias power P0 for a time period T4 (OFF period), where the RF bias power P1 is greater than the RF bias power P0. According to some embodiments of the invention, the RF bias power P2 can be less than the RF bias power P1, and can be less than 100 W, for example 90 W, 80 W, 70 W, 60 W, 40 W, 30 W, or even lower. The RF bias power P0 can be 0 W or greater than 0 W, for example 10 W, 20 W, 30 W, 40 W, 50 W, or greater. According to some embodiments of the invention, the time period T3 can be greater than the time period T4. In other words, the duty cycle (T3/T3+T4) can be greater than 0.5 (50%), for example greater than 0.6 (60%), greater than 0.7 (70%), greater than 0.8 (80%), or even greater than 0.9 (90%). In some examples, the duty cycle used in the OE step can be lower than the duty cycle used in the ME step. The pulsing frequency of the RF bias power P1 can be greater than 1 Hz, for example 2 Hz, 4 Hz, 6 Hz, 8 Hz, 10 Hz, 20 Hz, 30 Hz, 50 Hz, or greater. For clarity, FIG. 2 only shows three pulse cycles of the pulsed RF bias power during the OE step but those skilled in the art will readily realized that a typical OE step will contain a large number of pulses.

Further, the plasma generation power supplied from the external microwave generator 15 can be greater during the ME step than during the OE step, and therefore the plasma density greater in the process chamber during the ME step than during the OE step. For example, a plasma generation microwave power applied during the ME step can be between 2000 W and 3000 W, for example 3000 W, and a plasma generation microwave power applied during the OE step can be between 1000 W and 2000 W, for example 1500 W. In one example, the plasma generation microwave power applied during the ME step can be between 2000 W and 3000 W, and the RF bias power can be 100 W or greater. In one example, the plasma generation microwave power applied during the OE step can be between 1000 W and 2000 W, and the RF bias power can be less than 100 W. In some examples, the process chamber pressure may be higher during the ME step than during the OE step. For example, the process chamber pressure can be between about 30 mTorr and about 200 mT during the ME step and between about 10 mTorr and about 150 mT during the OE step. Etching times for the ME step depend on the thickness of the SiN film. In some examples, the etching times for the ME step can be between 1 minute and 10 minutes and etching times for the OE step can be between 10 seconds and 2 minutes. Table I shows exemplary plasma etching conditions for ME and OE according to embodiments of the invention.

TABLE I

Exemplary plasma etching conditions for ME and OE.

| Step | P (mTorr) | Power Top/Bot (W/W) | Duty cycle | Ar (sccm) | $O_2$ (sccm) | $CF_4$ (sccm) | HBr (sccm) |
|---|---|---|---|---|---|---|---|
| ME | 100 | 3000/150 | 90% (10 Hz) | 200 | 50 | 100 | 800 |
| OE | 30 | 1500/50 | 75% (10 Hz) | 250 | 70 | 50 | 100 |

Although plasma etch processing may be particularly useful for etching multiple adjacent structures with fine features, as depicted in FIGS. 1A-1C, as demands on feature size and spacing become more stringent, limitations of plasma etch processes have become more apparent. One common limitation of plasma etching is with respect to the fabrication of an integrated circuit (IC) with variable spacing between various semiconductor structures on the same substrate. For example, the etch rate may exhibit a dependence on pattern density, a phenomenon referred to as "micro-loading". At very small dimensions and particularly in high aspect ratio regimes, the etch rate of a material that has been patterned with a high density (i.e., smaller spacings between features) may be slower than the etch rate of the same materials patterned with a low density (i.e., larger spacings between features). Thus, an over-etching (OE) step may be required to fully etch all of the various structures on the same substrate, i.e., the areas that are first to completely etch continue to be exposed to the etch process while areas that have not completely etched undergo completion of the etch process. In some cases, the OE step may have detrimental impact on the resultant semiconductor structures if the OE step does not show good selectivity to the underlying materials. The high etch selectivity of the SiN film 102 relative to the substrate 101 and mask pattern 103 described above, significantly reduces or eliminates the micro-loading effect when plasma etching the SiN film 102 covered by the mask pattern 103.

As described above, in order to improve etch selectivity of the SiN film 102 to the mask pattern 103, the ME step, the OE step, or both the ME step and the OE step, are performed by pulsing the RF bias power level applied to the substrate holder supporting the substrate 101. The improved etch selectivity of the SiN film 102 relative to the mask pattern 103 observed by pulsing the RF bias power is believed to be due to hard mask protection during the OFF periods of the pulsing of the RF bias.

Figure 3A:
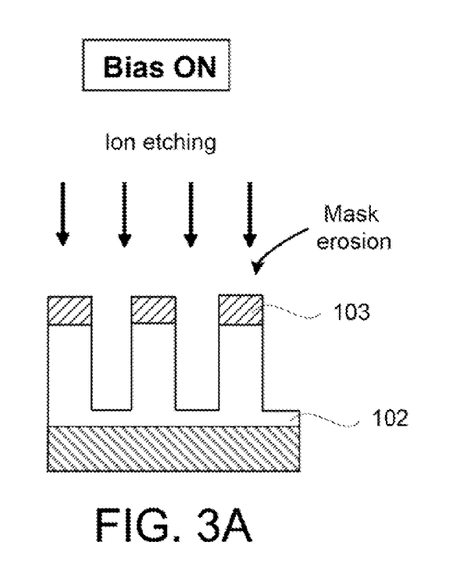
FIGS. 3A and 3B schematically show effects of pulsing RF bias power to a substrate during plasma etching according to embodiments of the invention.
Figure 3B:
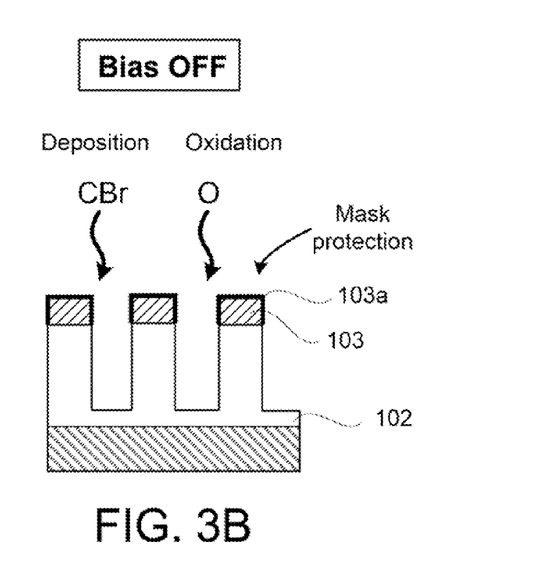

FIGS. 3A and 3B schematically show effects of pulsing RF bias power to a substrate during plasma etching according to embodiments of the invention. FIG. 3A schematically shows the effects of applying RF bias power to a substrate during transfer of the mask pattern 103 into the SiN film 102, where ions in the plasma are strongly accelerated towards the substrate and cause ion etching of the SiN film 102 and plasma erosion of the mask pattern 103. FIG. 3B schematically shows the effects of not applying RF bias power to the substrate, where ions in the plasma are not strongly accelerated towards the substrate and the plasma process proceeds by formation of a protection layer 103a on the mask pattern 103 by deposition and oxidation by exposure of the mask pattern 103 to neutral radicals (e.g., CBr and O). The protection layer 103a formed by the pulsing of the RF bias power protects the mask pattern during a subsequent RF bias ON period, thereby increasing the etch selectivity of the SiN film 102 relative to the mask pattern 103.

Figure 4:
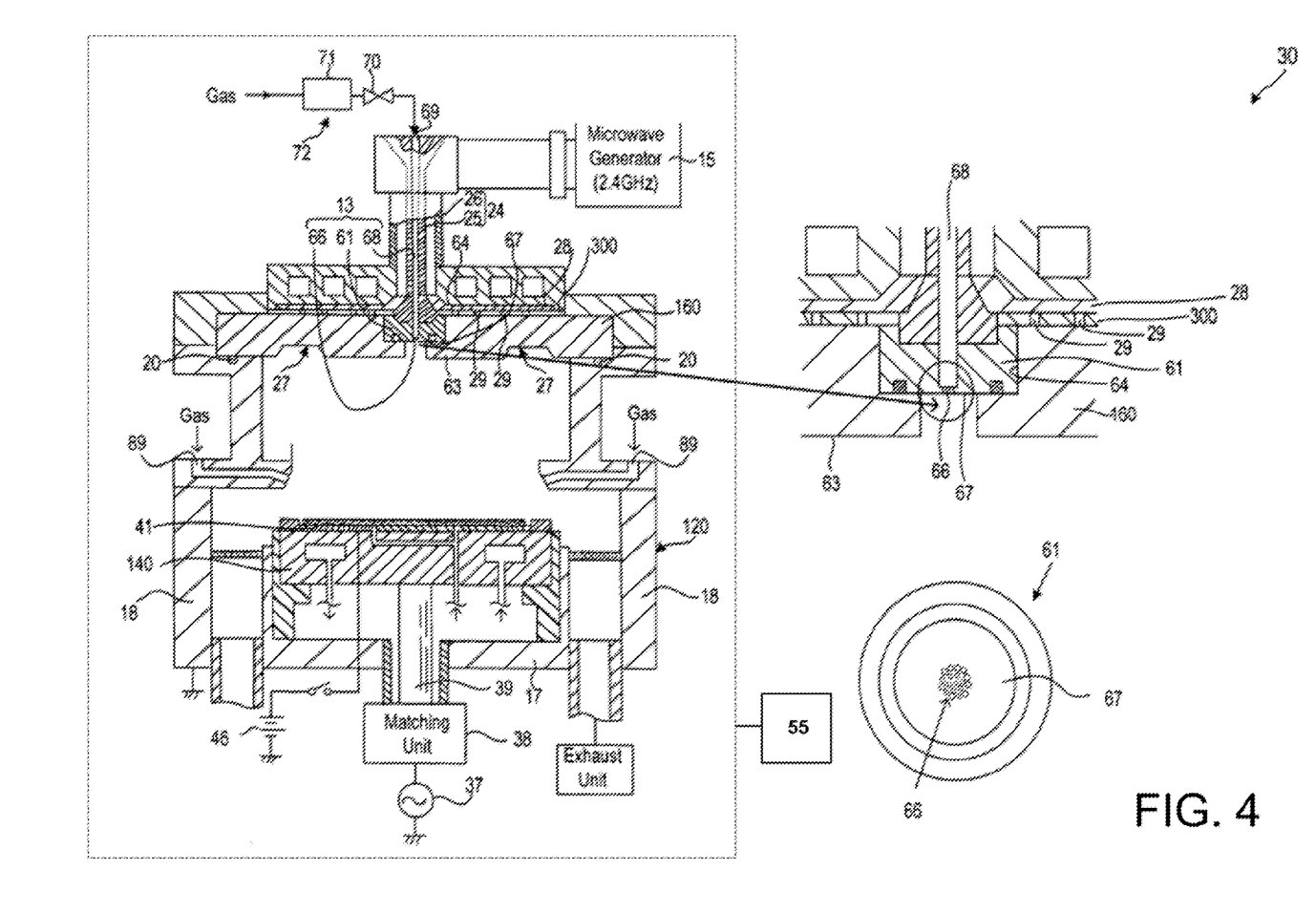
FIG. 4 is a schematic diagram of a plasma processing system containing a radial line slot antenna (RLSA) plasma source for SiN pattern etching according to one embodiment of the invention.

FIG. 4 is a schematic diagram of a plasma processing system containing a radial line slot antenna (RLSA) plasma source for SiN pattern etching according to one embodiment of the invention. The plasma processing system 30 includes a process chamber 120, a radial line slot plate 300, a substrate holder 140 adapted to support a substrate to be processed (e.g., a 300 mm Si wafer), and a dielectric window 160. The process chamber 120 includes a bottom portion 17 located below the substrate holder 140 and cylindrical sidewall 18 that extends upwards from the circumference of the bottom portion 17. An upper portion of the process chamber 120 is open-ended. The dielectric window 160 is positioned opposite the substrate holder 140 and is sealed to the upper side of the process chamber 120 via O-rings 20. The plasma processing system 30 further includes a controller 55 that is configured to control the processing conditions and overall operation of the plasma processing system 30.

An external microwave generator 15 provides microwave power of a predetermined frequency, e.g., 2.45 GHz, to the radial line slot plate 300 via a coaxial waveguide 24 and a slow-wave plate 28. The external microwave generator 15 can be configured for providing microwave power between about 1000 W and 3000 W. The coaxial waveguide 24 may include a central conductor 25 and a circumferential conductor 26. The microwave power is then transmitted to the dielectric window 160 through a plurality of slots 29 provided on the radial line slot plate 300. The microwave from the microwave generator 15 creates an electric field just below the dielectric window 160, which in turn causes excitation of a plasma gas within the process chamber 120. A concave part 27, provided on an inner side of the dielectric window 16, enables an effective plasma generation inside the process chamber 120.

An external high-frequency power supply source 37 is electrically connected to the substrate holder 140 via a matching unit 38 and an electric power supply pole 39. The high-frequency power supply source 37 generates an RF bias power of a predetermined frequency, e.g., 13.56 MHz, for controlling energy of ions that are drawn to a substrate. The matching unit 38 matches an impedance of the RF power supply source to an impedance of the load, e.g., the process chamber 120. According to embodiments of the invention, the microwave power provided by the external microwave generator 15 is utilized for generating plasma from a process gas in the process chamber 120 and the external high-frequency power supply source 37 is independently controlled from the external microwave generator 15 for accelerating ions in the plasma towards the substrate. An electrostatic chuck 41 is provided on an upper surface of the substrate holder 140 for holding the substrate by an electrostatic absorption power, via a DC power supply source 46.

The substrate holder 140 is adapted to receive RF bias power (signal) from the high-frequency power supply source 37 such that the substrate holder 140 serves as a biasing element with respect to the RF bias power to accelerating ionized gases towards the substrate during the etching process. The high-frequency power supply source 37 is configured to provide pulsing of the RF bias power as schematically shown in FIG. 2 and the pulsing frequency can be greater than 1 Hz, for example 2 Hz, 4 Hz, 6 Hz, 8 Hz, 10 Hz, 20 Hz, 30 Hz, 50 Hz, or greater.

It is noted that one skilled in the art will appreciate that the power levels of the high-frequency power supply source 37 are related to the size of the substrate being processed. For example, a 300 mm Si wafer requires greater power consumption than a 200 mm wafer during processing.

The plasma processing system 30 further includes a process gas supply part 13. An enlarged view of the process gas supply part 13 is also shown in FIG. 4. As shown in this figure, the process gas supply part 13 may include a base injector 61 located at a backward position, inside the dielectric window 160, compared to a lower surface 63 of the dielectric window 160. The process gas supply part 13 further includes a base holder 64 which extends through a portion of the thickness of the dielectric window 160 to hold the base injector 61. A plan view of the base injector 61 is also shown in FIG. 4. As shown in this figure, a plurality of supply holes 66 are provided on a flat wall surface 67 which is positioned opposite to the substrate holder 140. The plurality of supply holes 66 are positioned radially at a center of the flat wall surface 67.

The process gas supply part 13 further includes a gas duct 68. As shown in FIG. 4, the gas duct 68 extends through a central conductor 25 from the coaxial waveguide 24, the radial line slot plate 300, and the dielectric window 160, to reach the plurality of supply holes 66. A gas supply system 72 is connected to a gas entrance hole 69 formed at an upper end of the central conductor 25. The gas supply system 72 may include an on-off valve 70 and a flow rate controller 71, e.g., a mass flow controller. Further, the process gas may be supplied into the process chamber 120 by two more gas ducts 89 provided on the cylindrical sidewall 18. The elemental composition of the process gas supplied into the process chamber 120 by the two or more gas ducts 89 may be the same as that of the process gas supplied into the process chamber 120 by the gas duct 68. According to some embodiments, the elemental composition of the process gas supplied into the process chamber 120 by the two or more gas ducts 89 may be independently controlled and may be different than the process gas supplied into the process chamber 120 by the gas duct 68. For some etch processes, the process chamber pressure may be controlled between about 10 mTorr and about 1000 mT.

Figure 5:
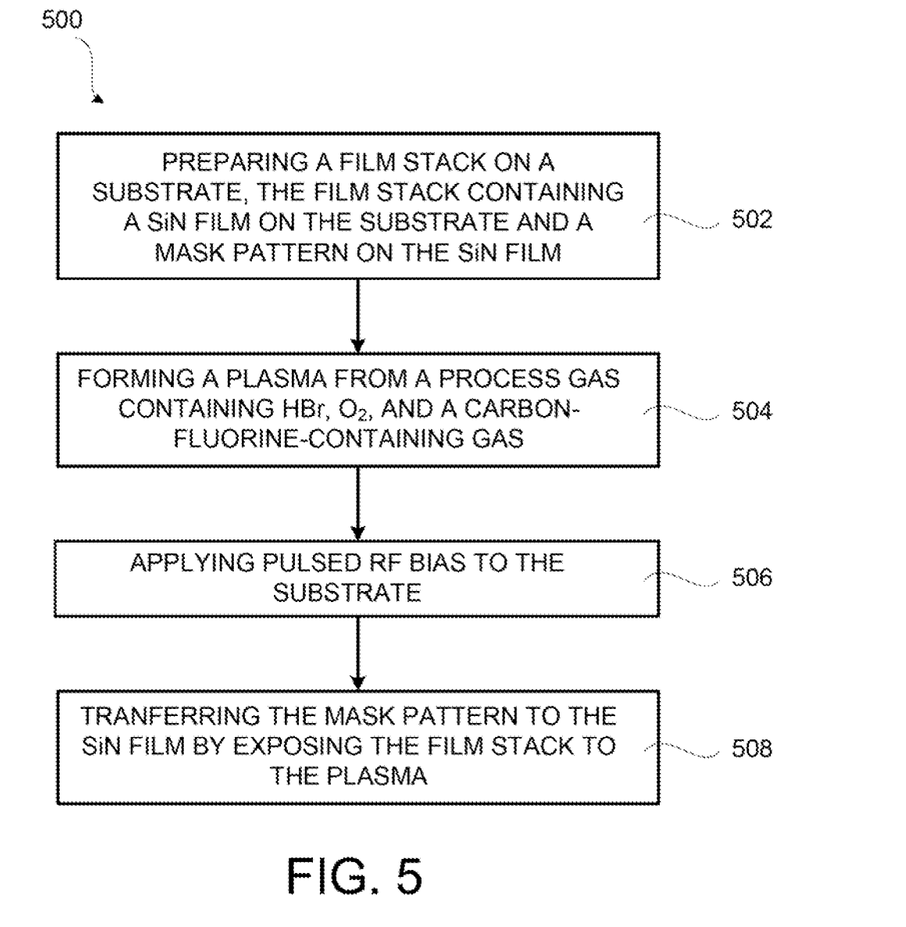
FIG. 5 depicts a flow diagram of a method of transferring a mask pattern through a SiN film on a substrate according to an embodiment of the invention.

FIG. 5 depicts a flow diagram of a method of transferring a mask pattern through a SiN film on a substrate according to an embodiment of the invention. The flow diagram 500 includes, in 502, preparing a film stack on a substrate, the film stack containing a SiN film on the substrate and a mask pattern on the SiN film. In some embodiments, the mask pattern can contain $SiO_2$, SiON, or a combination thereof, and the substrate can contain $SiO_2$, Si, or a combination thereof.

In 504, a plasma is formed from a process gas containing HBr gas, $O_2$ gas, and a carbon-fluorine-containing gas. The carbon-fluorine-containing gas can contain a fluorocarbon gas, a hydrofluorocarbon gas, or a combination thereof. In one example, the fluorocarbon gas contains or consists of $CF_4$. In some examples, the hydrofluorocarbon gas contains or consists of $CHF_3$, $CH_2F_2$, or $CH_3F$, or a combination thereof. According to one embodiment, the plasma may be formed by exciting the process gas by a microwave plasma source including a radial line slot antenna (RLSA).

In 506, pulsed RF bias power is applied to the substrate. According to one embodiment of the invention, the pulsed RF bias power may be applied to the substrate through a substrate holder supporting the substrate.

In 508, the mask pattern is transferred to the SiN film by exposing the film stack to the plasma. According to one embodiment, the transferring includes etching through less than an entire thickness of SiN film in a main etch (ME) step, and thereafter, etching through a remaining thickness of the SiN film and stopping on the substrate in an over etch (OE) step. In one example, the transferring includes applying a first pulsed RF bias power level to the substrate during the ME step, and applying a second pulsed RF bias power level to the substrate during the OE step. According to one embodiment of the invention, the first pulsed RF bias power can be greater than the second pulsed RF bias power.

EXPERIMENTAL EXAMPLES

According to embodiments of the invention, the plasma processing utilizes a process gas containing HBr gas, $O_2$ gas, and a carbon-fluorine-containing gas to etch SiN films. In order to evaluate the effect of HBr gas flow on lateral SiN etch and the effect of pulsed RF bias on selectivity of SiN etch relative to etching of the mask pattern, several test samples having the film structure 100 described in FIG. 1A were prepared and subjected to the plasma etching process according to embodiments of the invention. A plasma processing system containing a radial line slot antenna (RLSA) plasma source as schematically shown in FIG. 4 was used.

Figure 6A:
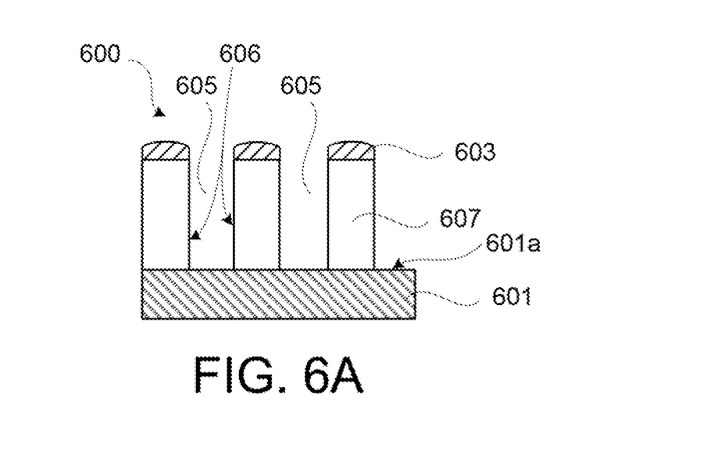
FIGS. 6A and 6B schematically show effects on SiN pattern etching using different HBr flows.
Figure 6B:
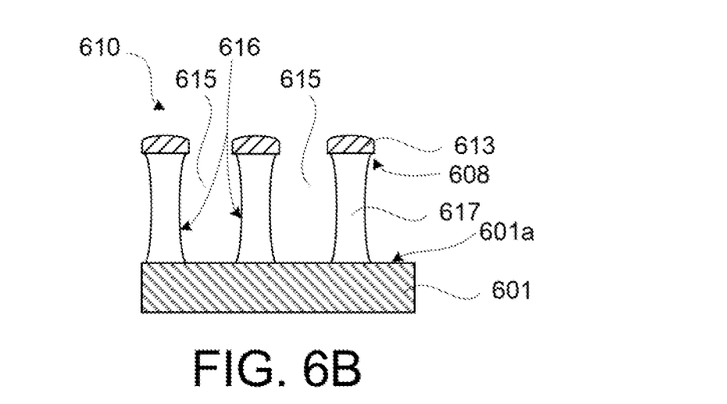

FIGS. 6A and 6B schematically show effects on SiN pattern etching using different HBr flows. Table II summarizes plasma etching conditions applied to test samples in a main etch (ME) step explained above in reference to FIGS. 1A-1B. The test samples contained a SiON mask pattern 103 with an initial thickness of 37 nm and a SiN film 102 under the SiON mask pattern 103. In Table II, the plasma processing conditions included process chamber pressure P of 100 mTorr, microwave power of 3000 W (Power Top) applied to the RLSA plasma source, RF bias power of 150 W (Power Bot) applied to the substrate holder, duty cycle of 75% at 10 Hz, Ar gas flow of 200 sccm, $O_2$ gas flow of 50 sccm, HBr gas flows of 600, 700, and 800 sccm, and etching time of 400 seconds. In order to improve heat transfer from the substrate holder to the backside of the substrate and improve substrate temperature uniformity, a He gas pressure of 15 Torr was used as heat-transfer medium in the space between the substrate holder and the substrate.

TABLE II

Plasma etching conditions applied to test samples.

| Step | P (mTorr) | Power Top/Bot (W/W) | Duty cycle | Ar (sccm) | $O_2$ (sccm) | $CF_4$ (sccm) | HBr (sccm) | Time (sec) |
|---|---|---|---|---|---|---|---|---|
| ME | 100 | 3000/150 | 75% (10 Hz) | 200 | 50 | 100 | 600-800 | 400 |

FIG. 6A schematically shows a film structure 600 after transfer of mask pattern 603 that forms SiN etch features 605 and SiN pattern 607 with straight SiN sidewalls 606 while stopping on the surface 601a of the substrate 601. The plasma etching conditions included the conditions shown in Table II with a HBr gas flow 800 sccm. FIG. 6B schematically shows a film structure 610 after transfer of mask pattern 613 that forms SiN etch features 615 and SiN pattern 617 with laterally etched SiN sidewalls 616 and undercut 608 in the SiN pattern 617 beneath the mask pattern 613. As depicted in FIG. 6B, the SiN pattern 617 has a concave structure due to the laterally etched sidewalls 616. The plasma etching conditions included the conditions shown in Table II with a HBr gas flow 600 sccm. In summary, FIGS. 6A and 6B schematically show that increasing the HBr gas flow from 600 sccm to 800 sccm, reduced lateral etch of the SiN pattern and eliminated undercut beneath the mask pattern.

Figure 7A:
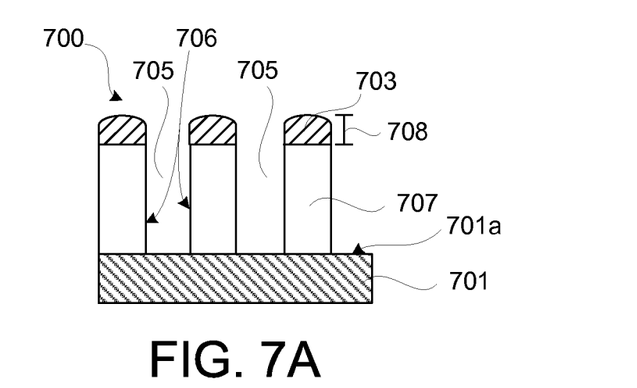
FIGS. 7A and 7B schematically show effects on SiN pattern etching using different duty cycles of pulsed RF biasing power.
Figure 7B:
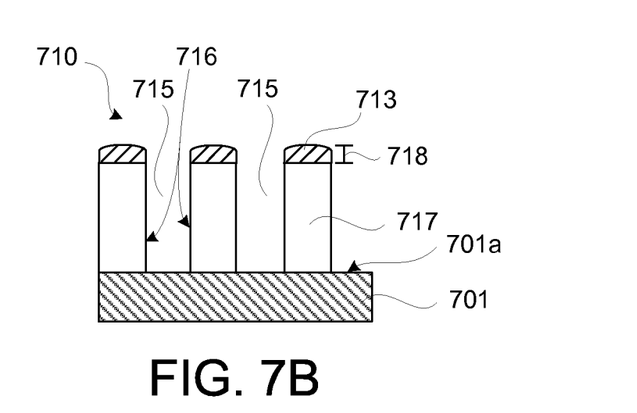

FIGS. 7A and 7B schematically show effects on SiN pattern etching using different duty cycles of pulsed RF biasing power Table III summarizes the plasma etching conditions applied to test samples in a main etch (ME) step explained above in reference to FIGS. 1A-1B. The test samples contained a SiON mask pattern 103 with an initial thickness of 37 nm and a SiN film 102 under the SiON mask pattern 103. In Table III, the plasma processing conditions included process chamber pressure P of 100 mTorr, microwave power of 3000 W (Power Top) applied to the RLSA plasma source, RF bias power of 150 W (Power Bot) applied to the substrate holder, duty cycles of 75, 90, and 100% at 10 Hz, Ar gas flow of 200 sccm, $O_2$ gas flow of 50 sccm, HBr gas flow of 800 sccm, and etching time of 400 seconds. In order to improve heat transfer from the substrate holder to the backside of the substrate and improve substrate temperature uniformity, a He gas pressure of 15 Torr was used as heat-transfer medium in the space between the substrate holder and the substrate.

TABLE III

Plasma etching conditions applied to test samples.

| Step | P (mTorr) | Power Top/Bot (W/W) | Duty cycle | Ar (sccm) | $O_2$ (sccm) | $CF_4$ (sccm) | HBr (sccm) | Time (sec) |
|---|---|---|---|---|---|---|---|---|
| ME | 100 | 3000/150 | 75-100% (10 Hz) | 200 | 50 | 100 | 800 | 400 |

FIG. 7A schematically shows a film structure 700 after transfer of mask pattern 703 that forms SiN etch features 705 and SiN pattern 707 with straight SiN sidewalls 706 while stopping on the surface 701a of the substrate 701. The plasma etching conditions included the conditions shown in Table III with a duty cycle of 75%. The post-etch mask thickness 708 was 27 nm. FIG. 7B schematically shows a film structure 710 after transfer of mask pattern 713 that forms SiN etch features 715 and SiN pattern 717 with straight SiN sidewalls 716. The plasma etching conditions included the conditions shown in Table III with a duty cycle of 100%. The post-etch mask thickness 718 was 9 nm. In summary, FIGS. 7A and 7B schematically show that a 100% duty cycle (continuous RF bias power) reduced the mask pattern thickness to 9 nm, while a 75% duty cycle reduced the mask pattern thickness to 27 nm. Thus, reducing the duty cycle from 100% to 75% increases the etch selectivity of the SiN film relative to the mask pattern.

The straight sidewall SiN profile and high etch selectivity is achieved using an etching gas containing HBr gas, $O_2$ gas, and a carbonfluorine-containing gas containing a fluorocarbon gas, a hydrofluorocarbon gas, or a combination thereof. The fluorocarbon gas can contain or consist of $CF_4$, and the hydrofluorocarbon gas can contain or consist of $CHF_3$, $CH_2F_2$, or $CH_3F$, or a combination thereof. The etching gas can further contain a noble gas such as argon (Ar) or helium (He).

A plurality of embodiments providing processing methods for plasma etching features in SiN films covered by a mask pattern have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for processing a substrate, comprising:
    preparing a film stack on a substrate, the film stack containing a silicon nitride (SiN) film on the substrate and a mask pattern on the SiN film;
    forming a plasma from a process gas containing HBr gas, $O_2$ gas, and a carbon-fluorine-containing gas;
    and transferring the mask pattern to the SiN film by exposing the film stack to the plasma, wherein the transferring comprises:
etching through less than an entire thickness of the SiN film in a main etch (ME) step, where a first pulsed RF bias power is applied to the substrate during the ME step; and
thereafter, etching through a remaining thickness of the SiN film and stopping on the substrate in an over etch (OE) step, wherein a second pulsed RF bias power is applied to the substrate during the OE step, the first pulsed RF bias power being greater than the second pulsed RF bias power, and wherein the
transferring forms a protection layer on the mask pattern when RF bias power is not applied to the substrate, the protection layer protecting the mask pattern when the RF bias power is applied to the substrate and increasing the etch selectivity of the SiN film relative to the mask pattern.

2. The method of claim 1, wherein the carbon-fluorine-containing gas is selected from a fluorocarbon gas, a hydrofluorocarbon gas, or a combination thereof.

3. The method of claim 2, wherein the fluorocarbon gas contains or consists of $CF_4$.

4. The method of claim 2, wherein the hydrofluorocarbon gas contains or consists of $CHF_3$, $CH_2F_2$, or $CH_3F$, or a combination thereof.

5. The method of claim 1, wherein a duty cycle of the first pulsed RF bias power is greater than that of the second pulsed RF bias power.

6. The method of claim 1, wherein forming the plasma includes exciting the process gas by a microwave plasma source including a radial line slot antenna (RLSA).

7. The method of claim 1, wherein the mask pattern comprises a SiON film, a $SiO_2$ film, or a combination thereof.

8. The method of claim 1, wherein the substrate comprises a Si film, a $SiO_2$ film, or a combination thereof.

9. A method for processing a substrate, comprising:
preparing a film stack on a substrate, the film stack containing a silicon nitride (SiN) film on the substrate and a mask pattern on the SiN film;
forming a plasma from a process gas containing HBr gas, $O_2$ gas, and a carbon-fluorine-containing gas; and
transferring the mask pattern to the SiN film by exposing the film stack to the plasma, the transferring comprising etching through less than an entire thickness of SiN film in a main etch (ME) step by applying a first pulsed RF bias power to the substrate during the ME step, and thereafter, etching through a remaining thickness of the SiN film and stopping on the substrate in an over etch (OE) step by applying a second pulsed RF bias power that is lower than the first pulsed RF bias power applied to the substrate during the ME process.

10. The method of claim 9, wherein the carbon-fluorine-containing gas is selected from a fluorocarbon gas, a hydrofluorocarbon gas, or a combination thereof.

11. The method of claim 10, wherein the fluorocarbon gas contains or consists of $CF_4$.

12. The method of claim 11, wherein the hydrofluorocarbon gas contains or consists of $CHF_3$, $CH_2F_2$, or $CH_3F$, or a combination thereof.

13. The method of claim 9, wherein forming the plasma includes exciting the process gas by a microwave plasma source including a radial line slot antenna (RLSA).

14. The method of claim 9, wherein a duty cycle of the first pulsed RF bias power is greater than that of the second pulsed RF bias power.

15. The method of claim 9, wherein the mask pattern comprises a SiON film, a $SiO_2$ film, or a combination thereof, and the substrate comprises a Si film, a $SiO_2$ film, or a combination thereof.

16. The method of claim 9, wherein transferring the mask pattern forms a protection layer on the mask pattern when RF bias power is not applied to the substrate, the protection layer protecting the mask pattern when the RF bias power is applied to the substrate and increasing the etch selectivity of the SiN film relative to the mask pattern.

17. A method for processing a substrate, comprising:
preparing a film stack on a substrate, the film stack containing a silicon nitride (SiN) film on the substrate and a mask pattern on the SiN film, the substrate containing a Si film, a $SiO_2$ film, or a combination thereof, and the mask pattern containing a SiON film, a $SiO_2$ film, or a combination thereof;
forming a plasma from a process gas containing HBr gas, $O_2$ gas, and a $CF_4$ gas by exciting the process gas by a microwave plasma source including a radial line slot antenna (RLSA); and
transferring the mask pattern to the SiN film by exposing the film stack to the plasma, the transferring comprising etching through less than an entire thickness of the SiN film in a main etch (ME) step by
applying a first pulsed RF bias power to the substrate during the ME step, and
thereafter, etching through a remaining thickness of the SiN film and stopping on the substrate in an over etch (OE) step by applying a second pulsed RF bias power that is lower than the first pulsed RF bias power applied to the substrate during the OE step.

18. The method of claim 17, wherein a duty cycle of the first pulsed RF bias power is greater than that of the second pulsed RF bias power.

19. The method of claim 17, wherein transferring the mask pattern forms a protection layer on the mask pattern when RF bias power is not applied to the substrate, the protection layer protecting the mask pattern when the RF bias power is applied to the substrate and increasing the etch selectivity of the SiN film relative to the mask pattern.

* * * * *